(12) United States Patent
Stamper et al.

(10) Patent No.: US 7,662,722 B2
(45) Date of Patent: Feb. 16, 2010

(54) AIR GAP UNDER ON-CHIP PASSIVE DEVICE

(75) Inventors: Anthony K. Stamper, Williston, VT (US); Anil K. Chinthakindi, Haymarket, VA (US); Douglas D. Coolbaugh, Essex Junction, VT (US); Timothy J. Dalton, Ridgefield, CT (US); Daniel C. Edelstein, White Plains, NY (US); Ebenezer E. Eshun, Wappingers Falls, NY (US); Jeffrey P. Gambino, Westford, VT (US); William J. Murphy, North Ferrisburgh, VT (US); Kunal Vaed, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 310 days.

(21) Appl. No.: 11/626,548

(22) Filed: Jan. 24, 2007

(65) Prior Publication Data

US 2008/0173976 A1    Jul. 24, 2008

(51) Int. Cl.
*H01L 21/302* (2006.01)
(52) U.S. Cl. ...................... 438/719; 438/702
(58) Field of Classification Search ................. 438/700, 438/702, 706, 714, 719, 723, 724, 725
See application file for complete search history.

(56) References Cited

U.S. PATENT DOCUMENTS

| | | | |
|---|---|---|---|
| 6,274,920 B1 * | 8/2001 | Park et al. ................. 257/531 |
| 6,531,376 B1 * | 3/2003 | Cai et al. .................. 438/422 |
| 7,166,902 B1 * | 1/2007 | Badrieh et al. ............. 257/532 |
| 2003/0071325 A1 * | 4/2003 | Xu et al. .................... 257/531 |
| 2005/0093668 A1 * | 5/2005 | Bueyuektas et al. ........ 336/200 |
| 2005/0225420 A1 * | 10/2005 | Chen ......................... 336/200 |
| 2007/0007623 A1 * | 1/2007 | Chan et al. ................. 257/531 |
| 2007/0087565 A1 * | 4/2007 | Culmsee et al. ............ 438/675 |
| 2008/0020488 A1 * | 1/2008 | Clevenger et al. ............ 438/3 |

OTHER PUBLICATIONS

C.H. Chen et al., "A Deep Submicron CMOS Process Compatible Suspending High-Q Inductor". IEEE Electron Device Letters, vol. 22/11, Nov. 2001.

* cited by examiner

*Primary Examiner*—Kin-Chan Chen
(74) *Attorney, Agent, or Firm*—Lisa U. Jaklitsch; Daryl K. Neff

(57) ABSTRACT

A method is provided for fabricating a microelectronic chip which includes a passive device such, as an inductor, overlying an air gap. In such method, a plurality of front-end-of-line ("FEOL") devices are formed in a semiconductor region of the microelectronic chip, and a plurality of stacked interlevel dielectric ("ILD") layers are formed to overlie the plurality of FEOL devices, the plurality of stacked ILD layers including a first ILD layer and a second ILD layer, where the second ILD layer is resistant to attack by a first etchant which attacks the first ILD layer. A passive device is formed to overlie at least the first ILD layer. Using the first etchant, a portion of the first ILD layer in registration with the passive device is removed to form an air gap which underlies the passive device in registration with the passive device.

17 Claims, 17 Drawing Sheets

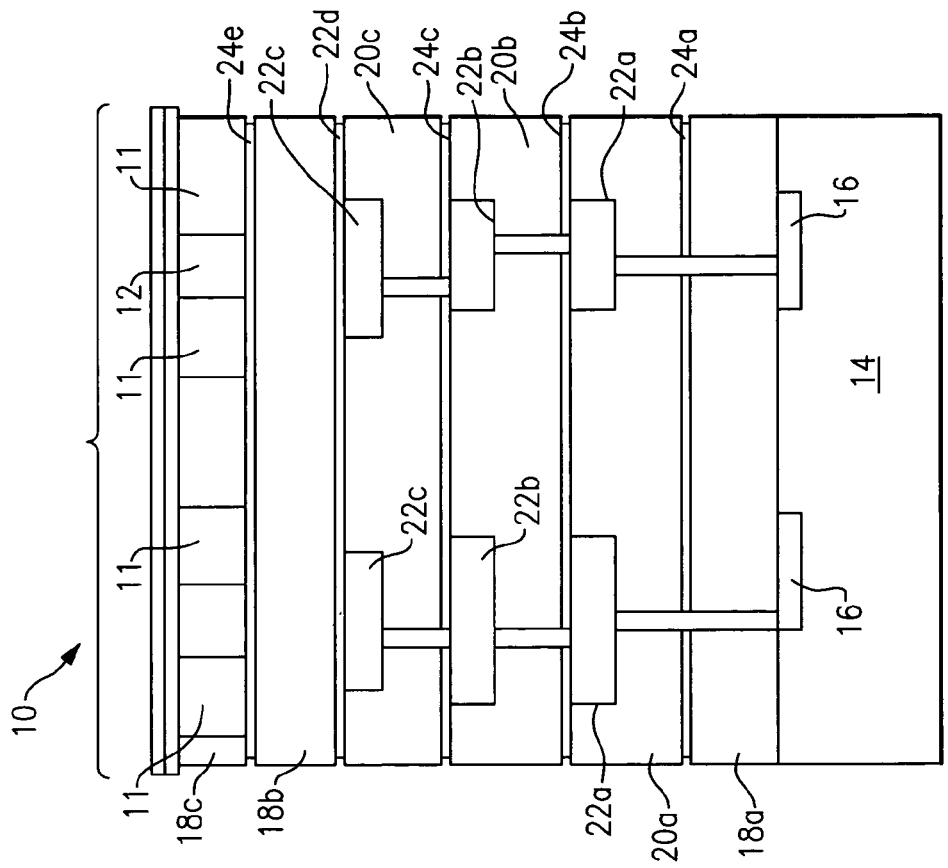
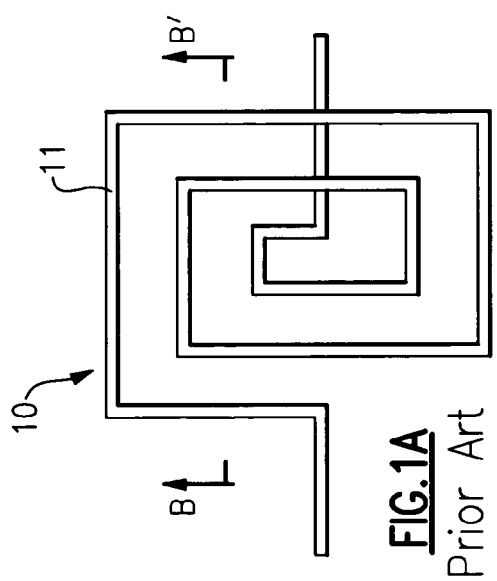
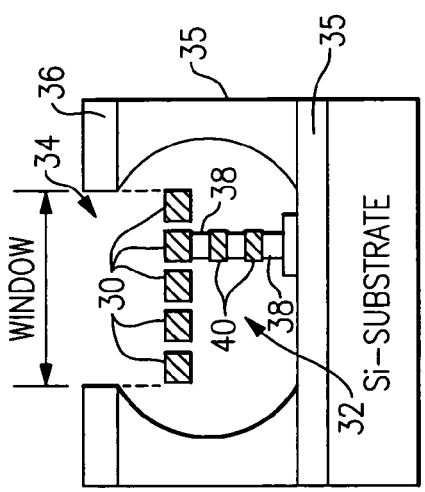
FIG.1A Prior Art
FIG.1B Prior Art
FIG.2 PRIOR ART

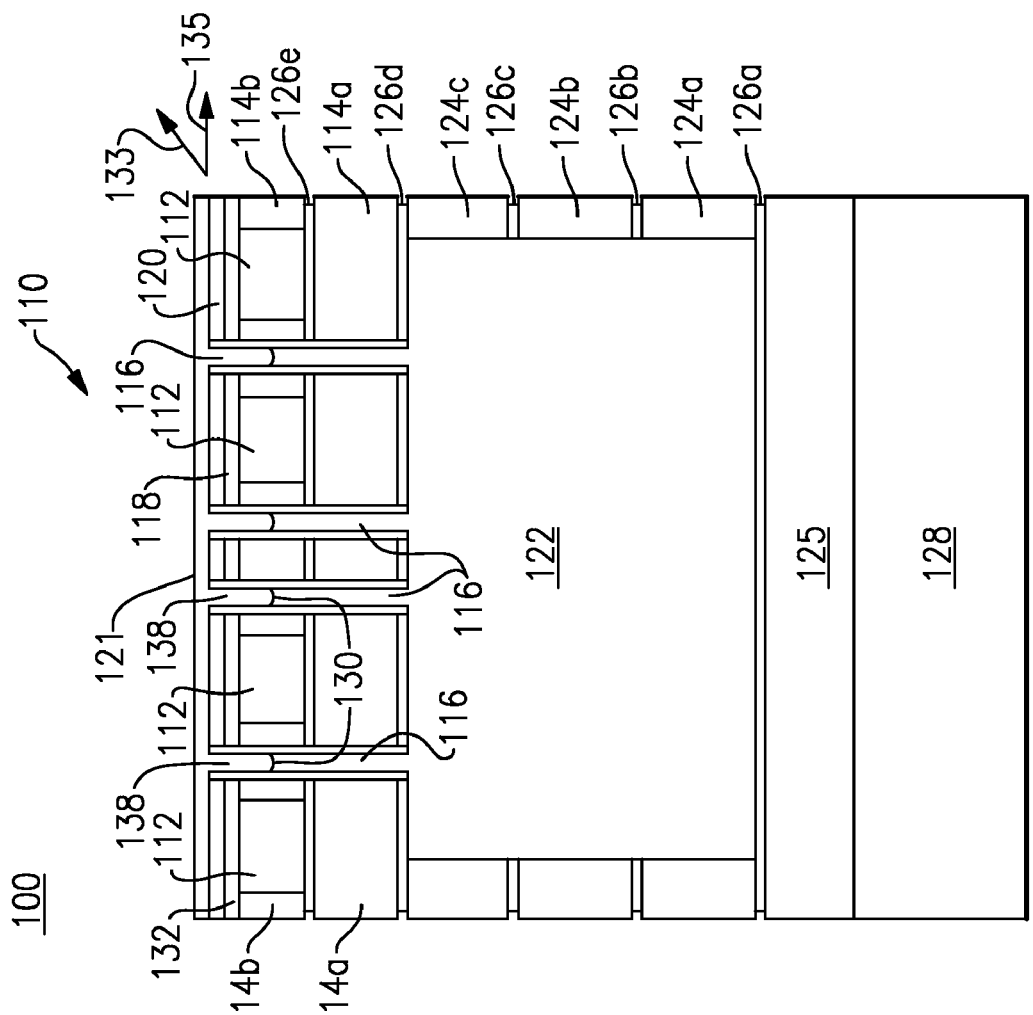
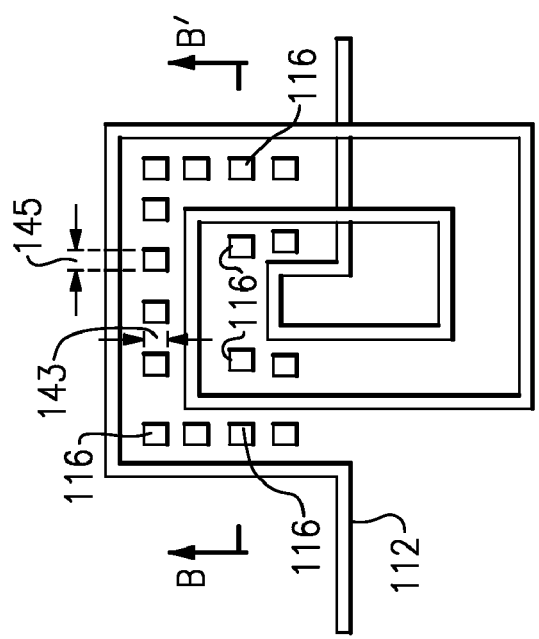
FIG.3A
FIG.3B

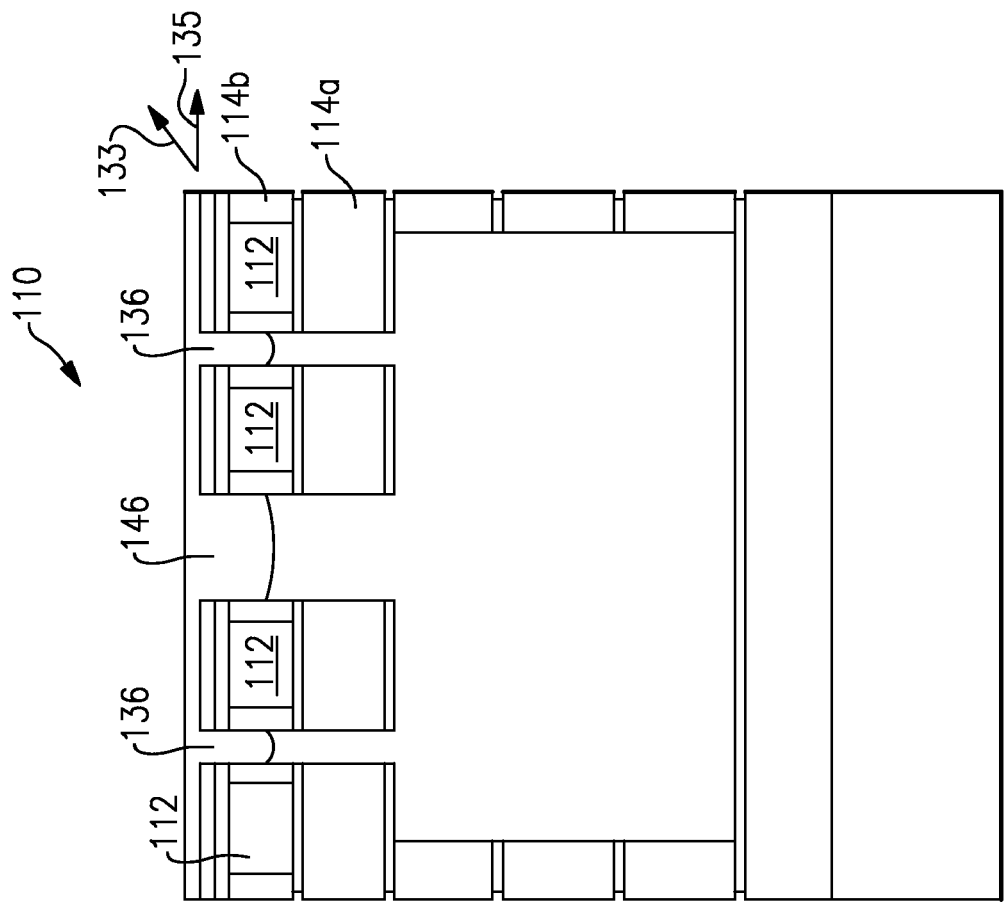
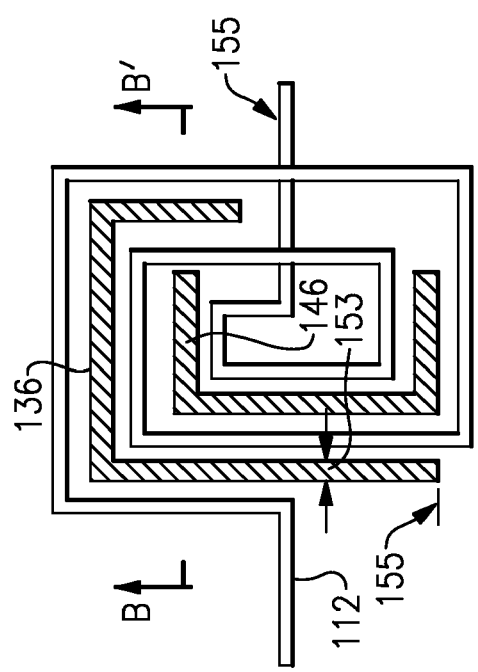
FIG. 4A
FIG. 4B

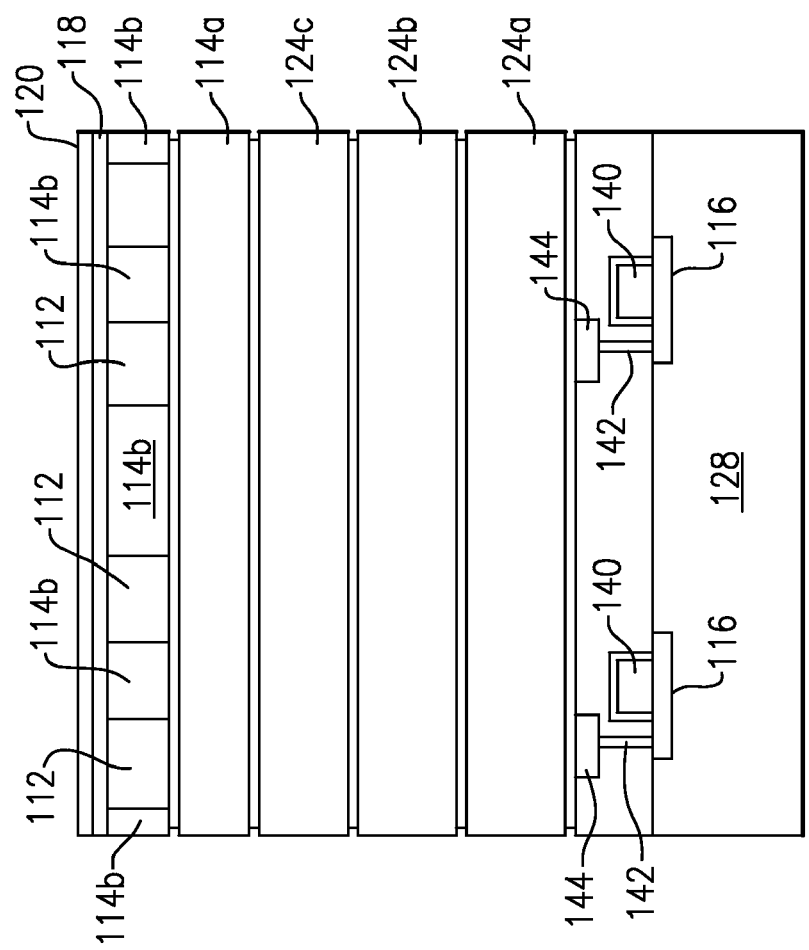
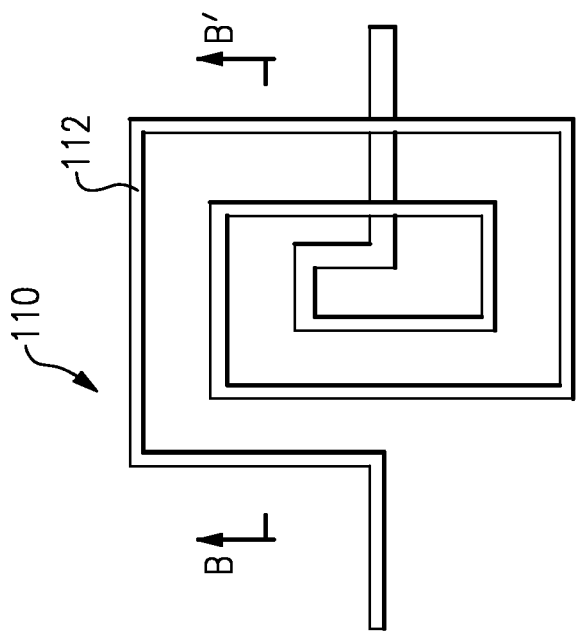
FIG.5B
FIG.5A

AIR GAP UNDER ON-CHIP PASSIVE DEVICE

BACKGROUND OF THE INVENTION

The present invention relates to microelectronics, and more specifically to a structure and method for providing an air gap for enhancing performance of an on-chip passive device overlying a semiconductor region of a semiconductor integrated circuit chip.

Techniques exist for providing passive devices, e.g., inductors, capacitors and/or resistors in a layer or region of an integrated circuit chip which overlies a semiconductor region in which active devices are provided. However, the performance of inductors and capacitors on such chips can be constrained by the type of dielectric material that is used to isolate their conductive portions from other features of the chip. For example, in the prior art chip illustrated in FIGS. 1A-1B, an inductor 10 includes a metal feature or other conductive feature which extends in a spiral pattern within a region 12 of a solid dielectric material which overlies a semiconductor region 14 of a microelectronic substrate such as a chip. The inductor 10 is provided at a level of the chip which is separated from the semiconductor region of the chip by several layers of interlevel dielectric ("ILD") material, or ILD layers. As particularly shown in FIG. 1B, the inductor 10 is embedded in an ILD layer consisting essentially of one or more inorganic dielectric materials 18c, such as an oxide or nitride of silicon, typically silicon dioxide. An ILD layer 18b underlying the ILD layer 18c typically also consists essentially of one or more inorganic dielectric materials. A further inorganic ILD layer 18a is provided in close proximity to the semiconductor region 18a. Between the inorganic ILD layer 18a and an the inorganic ILD layer 18b immediately below the inductor 10, a stack including a plurality of organic ILD layers 20a, 20b, 20c are provided. Each of the organic ILD layers typically consists essentially of an inorganic dielectric material such as a low-K (low dielectric constant) material, e.g. SiCOH or an organic dielectric material commonly known as polyarylene(ether) ("PAE") or SiLK™ (supplied by Dow Chemical).

Conductive metal patterns 22a, 22b, 22c, which can include a variety of metals such as copper, are used to interconnect features of the chip typically are embedded in the organic ILD layers. The low dielectric constant material of the organic ILD layers therein reduces parasitic capacitance associated by the juxtaposition of conductive metal patterns. The reduced dielectric constant material also allows the conductive metal patterns to be larger and placed at a tighter pitch than would be permitted if a dielectric material having a higher dielectric constant were used. Between each pair of immediately adjacent ILD layers a dielectric cap layer is provided, which typically includes a material which functions as a barrier to prevent diffusion of contaminating substances, especially copper, into the ILD layers, especially to protect ILD layers of SiCOH, SiLK™ or silicon oxide. Specifically, between a dielectric cap layer 24a is provided between layer 18a and layer 20a, and a dielectric cap layer 24b is provided between layer 20a, and 20b, etc. The dielectric cap layers typically consist essentially of a material such as silicon nitride or silicon carbo-nitride. A top dielectric cap layer 25 overlies the uppermost ILD layer, and a passivation layer 27 overlies the top dielectric cap layer. The top dielectric cap layer 25 typically consists essentially of silicon nitride, and the passivation layer 27 typically consists essentially of silicon dioxide.

One problem of the structure shown in FIGS. 1A and 1B is the close proximity to the inductor 10 of dielectric materials in ILD layers which do not have low dielectric constants. The relative dielectric constants of silicon dioxide and silicon nitride are approximately 4 and 7, respectively, and the dielectric constants of the low-K organic dielectric materials are well above 1.0, typically on the order of 2-3.5. The presence of the dielectric materials is a source of parasitic capacitance as well as a decrease in the "Q" factor of the inductor (a metric of the RF performance of the device), due to coupling with substrate.

Prior attempts to address this problem have led to other problems. For example as illustrated in FIG. 2, the article by C. H. Chen et al. "A Deep Submicron CMOS Process Compatible Suspending High-Q Inductor", IEEE Elec. Dev. Lett., vol. 22, p. 523, 2001 describes an arrangement in which metal patterns 30 which form an inductor lie unsupported within an air gap 32 formed by isotropically etching a region 34 of relatively low density silicon dioxide. The silicon dioxide region 34 is exposed through a window in a layer of silicon nitride 36 overlying the silicon dioxide region 34, which in turn, overlies a relatively dense oxide region 35 such as a field oxide region overlying a semiconductor substrate 37. Other than through one stack of conductive vias 38 and horizontally disposed metal features 40, the metal patterns 30 of the inductor lie entirely unsupported.

The arrangement shown in the article by Chen is subject to various problems. The metal patterns 30 are unsupported by dielectric material, either below, above, or between individual metal lines of the inductor. Mechanical stresses such as shock and vibration, as well as thermal expansion and contraction stresses, can cause the metal lines to move relative to each other and potentially cause the metal lines to weaken or break. In addition, the process of making the air gap is not robust. Variability in the etch rate and timing of the etch process used to hollow out the air gap 32 can lead to an air gap having variable volume. This may cause the finished inductor to exhibit inconsistent performance.

SUMMARY OF THE INVENTION

According to an aspect of the invention, a method is provided for fabricating a microelectronic chip which includes a passive device such, as an inductor, overlying an air gap. In such method, a plurality of front-end-of-line ("FEOL") devices are formed in a semiconductor region of the microelectronic chip, and a plurality of stacked interlevel dielectric ("ILD") layers are formed to overlie the plurality of FEOL devices, the plurality of stacked ILD layers including a first ILD layer and a second ILD layer, where the second ILD layer is resistant to attack by a first etchant which attacks the first ILD layer. A passive device is formed to overlie at least the first ILD layer. Using the first etchant, a portion of the first ILD layer in registration with the passive device is removed to form an air gap which underlies the passive device in registration with the passive device.

According to another aspect of the invention, a microelectronic chip is provided in which an inductor is supported partially by a dielectric region of a substrate, the substrate including a single-crystal semiconductor region underlying the inductor. A cavity underlies at least some conductors of the inductor in registration with those conductors. A dielectric layer overlies the conductors and hermetically seals the conductors and the cavity.

BRIEF DESCRIPTION OF THE DRAWINGS

FIG. 1A is a top plan view of an on-chip inductor structure in accordance with the prior art.

FIG. 1B is a corresponding sectional view of the on-hip inductor structure illustrated in FIG. 1A.

FIG. 2 is a sectional view of another on-chip inductor structure in accordance with the prior art.

FIG. 3A is a top plan view of an on-chip inductor structure in accordance with an embodiment of the invention.

FIG. 3B is a corresponding sectional view of the on-hip inductor structure illustrated in FIG. 3A.

FIG. 4A is a top plan view of an on-chip inductor structure in accordance with another embodiment of the invention.

FIG. 4B is a corresponding sectional view of the on-chip inductor structure illustrated in FIG. 4A.

FIG. 5A is a top plan view illustrating a preliminary stage in the fabrication of the on-hip inductor structure illustrated in FIGS. 3A-3B.

FIG. 5B is a sectional plan view illustrating a preliminary stage in the fabrication of the on-chip inductor structure illustrated in FIGS. 3A-3B.

DETAILED DESCRIPTION

Figure 6:
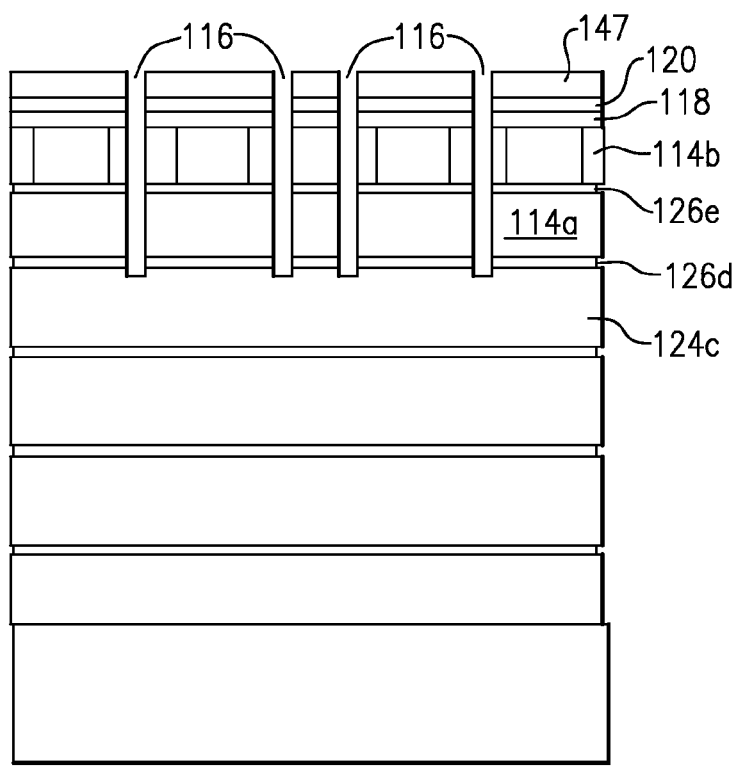
FIGS. 6 through 8 are sectional views illustrating succeeding stages in the fabrication of the on-chip inductor structure illustrated in FIGS. 3A-3B.

A microelectronic chip 100 in accordance with an embodiment of the invention is illustrated in FIGS. 3A and 3B. The chip includes a semiconductor region 128 in which active devices are provided, which may be conductively connected together in form of an integrated circuit. A passive device 110, e.g., an inductor, includes a plurality of metal patterns 112 which overlie the semiconductor region 128. As illustrated in FIG. 3B, the metal patterns 112 preferably include or consist essentially of a metal such as copper and are disposed in an "inorganic" interlevel dielectric ("ILD") layer 114b, the ILD layer 114b illustratively including an inorganic dielectric material such as silicon dioxide, SiCOH, porous SiCOH, fluorinated silicon dioxide ("FSG"), porous silicon dioxide, and the like. Another inorganic ILD layer 114a is disposed underneath and adjacent to the ILD layer 114b. At least one, and preferably, a plurality of low-K ILD layers, e.g., ILD layers 124a, 124b, 124c, etc., include or consist essentially of a low-K (low permittivity) dielectric material such as, for example, polyarylene(ether) ("PAE"), or other low-K material such as SiCOH. SiLK™, manufactured by Dow Chemical Corporation, is one example of PAE. These low-K ILD layers are disposed between the ILD layers 114a, 114b and an inorganic dielectric layer 125 provided adjacent to the semiconductor region 128. Dielectric cap layers 126a 126b, 126c, 126d and 126e are disposed between successive ones of the ILD layers. Each of the dielectric cap layers 126a, 126b and 126c preferably consists essentially of silicon carbide (SiC). The dielectric cap layers 126d and 126e preferably include or consist essentially of a material such as, for example, silicon nitride which is different from that of the dielectric cap layers 126a, 126b and 126c. Alternatively, in a particular embodiment, these dielectric cap layers 126d and 126e can consist essentially of SiC and that material may be the same as that included in dielectric cap layers 126a, 126b and 126c. Other dielectric cap materials, such as SiCN, could be substituted for the SiC.

Each dielectric cap layer typically is thinner than adjacent ILD layers of the structure between which it lies. Each dielectric cap layer serves as a diffusion barrier layer between successive ILD layers in which metal features or other features, especially those including copper, may be housed. A top dielectric cap layer 118 overlies the uppermost ILD layer, and a passivation layer 120 overlies the top dielectric cap layer. An additional passivation layer 121 seals the chip 100, preferably providing a hermetic barrier to contaminants and moisture from the environment external to the chip. The top dielectric cap layer 118 preferably consists essentially of silicon nitride, and the passivation layer 120 preferably consists essentially of silicon dioxide, although it is possible for the passivation layer to consist essentially of another material which may be either inorganic or organic in composition.

The embodiments of the invention provided herein recognize that the performance of an inductor improves when the permittivity of a dielectric in proximity thereto is decreased. For this reason, in the chip 100 shown in FIG. 3B, a cavity 122, e.g., an evacuated voids air gap or other gas-filled cavity underlies the metal patterns 112 of the inductor, in registration therewith. A plurality of openings 116 extend through the ILD layer 114b and another inorganic ILD layer 114a between the metal patterns 112 and the cavity 122. As illustrated in FIG. 3A-3B, the ILD layer 114b has a major surface 132 which defines a plane, there being a lateral direction 133 and a longitudinal direction 135 aligned with the plane. Each of the openings 116 occupies a portion of the major surface 132 of the ILD layer 114b which has a width 143 in one direction, e.g., lateral dimension, aligned with the plane of the major surface as it has a length 145 in another direction, e.g., longitudinal dimension, aligned with the major surface. In a preferred embodiment, neither one of the width 143 or the length 145 of the openings is greater than about twice the other of the width or length of the openings. The width 143 and length 145 preferably are about the same.

The openings 116 are sealed at least partially with a dielectric material 130 extending downward from passivation layer 121. Preferably, a dielectric lining 138 extends along walls of the openings, the dielectric lining 138 preferably including an inorganic dielectric material such as silicon nitride. Additional dielectric material 130 preferably closes the gap between the lining 138 which extends along walls of the openings 116. The additional dielectric material 130 can include the same dielectric material or a different dielectric material from that of which the lining is composed. For examples when the dielectric lining consists essentially of silicon nitride, the gap-filling dielectric material within each opening can, but need not consist essentially of a different material such as silicon dioxide or a low-K dielectric material such as SiCOH or PAE. Use of a low-K dielectric material for the gap-filling dielectric 130 can further improve performance of the inductor 110.

FIGS. 4A and 4B are a top-down plan view and corresponding sectional view, respectively of a microelectronic chip having a passive device in accordance with a variation of the embodiment of the invention illustrated in FIGS. 3A and 3B. In this embodiment, openings 136 and 146 in the inorganic ILD layers 114a and 114b are elongated. Each opening has a length in a direction aligned to the plane of the major surface 132 which is much greater than the width of the opening in another direction aligned to the plane of the major surface. The length of each opening 136 or each opening 146 is defined as an end-to-end dimension of the opening in a direction aligned to the plane of the major surface. The length of opening 136 is referenced in FIG. 4A by 155. The width of each opening 136 or 146 is defined as the width across the opening in a direction perpendicular to the length.

In accordance with an embodiment of the invention, a preferred method of fabricating a passive device having an air gap underlying the passive device will now be described with reference to FIGS. 5A through 8. FIG. 5A is a top down view illustrating a metal wiring pattern 112 for a horizontally disposed spiral inductor 110 which has already been formed as an embedded feature within a dielectric layer of a chip.

FIG. 5B is a corresponding sectional view through line B-B' of FIG. 5A, showing the inductor metal wiring pattern 112 as embedded within an inorganic ILD layer 114b. As shown and described above with reference to FIGS. 3A-3B, an ILD layer 114b, preferably inorganic in composition, overlies an adjacent inorganic ILD layer 114a, the ILD layer 114a having portions in registration with the inductor metal wiring patterns 112, A series of low-K ILD layers 124a, 124b and 124c, including or consisting essentially of a material such as SiCOH or PAE, for example, underlie the inorganic dielectric layers 114a and 114b. As also described above, an initial dielectric layer 125 is disposed adjacent to a semiconductor region 128, and the semiconductor region typically includes one or more active semiconductor devices 116 which are interconnected to other devices of the chip through local conductors 140 and local contacts 142 and other interconnect features 144. The initial dielectric layer 125 typically consists essentially of one or more inorganic materials such as a silicate glass, an oxide of silicon, an oxide of nitride or other oxide material or nitride material or a combination of such materials.

In the subsequent stage of processing shown in FIG. 6, a photo-imageable masking layer 147 is deposited to overlie the existing passivation layer 120 and patterned by photolithography to form a pattern having openings which expose the passivation layer 120. Typically, the photo-imageable masking layer 147 consists essentially of photoresist ("PR"), although it can include an anti-reflective coating ("ARC"), bottom anti-reflective coating ("BARC") or other photo-imageable material as an alternative to PR or in addition thereto. Thereafter, an anisotropic vertical etch process such as a reactive ion etch process which etches silicon dioxide and silicon nitride is used to extend the openings 116 downward successively through the passivation layer 120, dielectric cap layer 118, ILD layer 114b, dielectric cap layer 126e, another ILD layer 114a and another dielectric cap layer 126e. The dielectric cap layers 126d and 126e preferably include or consist essentially of silicon nitride. Alternatively, these dielectric cap layers 126d and 126e can consist essentially of the same material as dielectric cap layers 126a, 126b and 126, for example, silicon carbide (SiC). As the etch process typically is performed on a timed basis, over-etching is preferably performed such that the openings extend at least somewhat into an uppermost organic ILD layer 124c.

Figure 7:
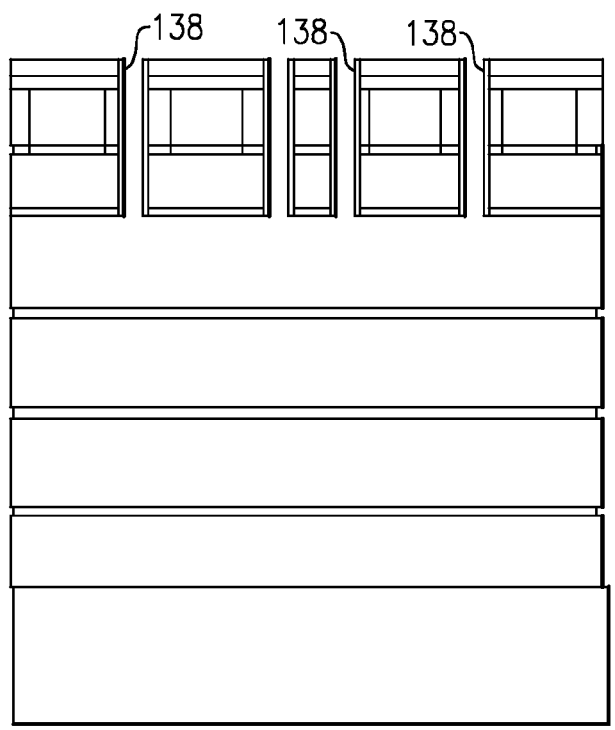

Thereafter, as illustrated in a FIG. 7, the masking layer 147 is stripped from the structure, after which a material is conformally deposited to form preferably thin linings 138 along walls of the openings 116. Preferably, the material is one which resists attack by an etchant which is used subsequently to hollow out the inorganic ILD layers 124a, 124b, and 124c to form an air gap. The deposited material 138 can consist essentially of silicon nitride, for example.

Figure 8:
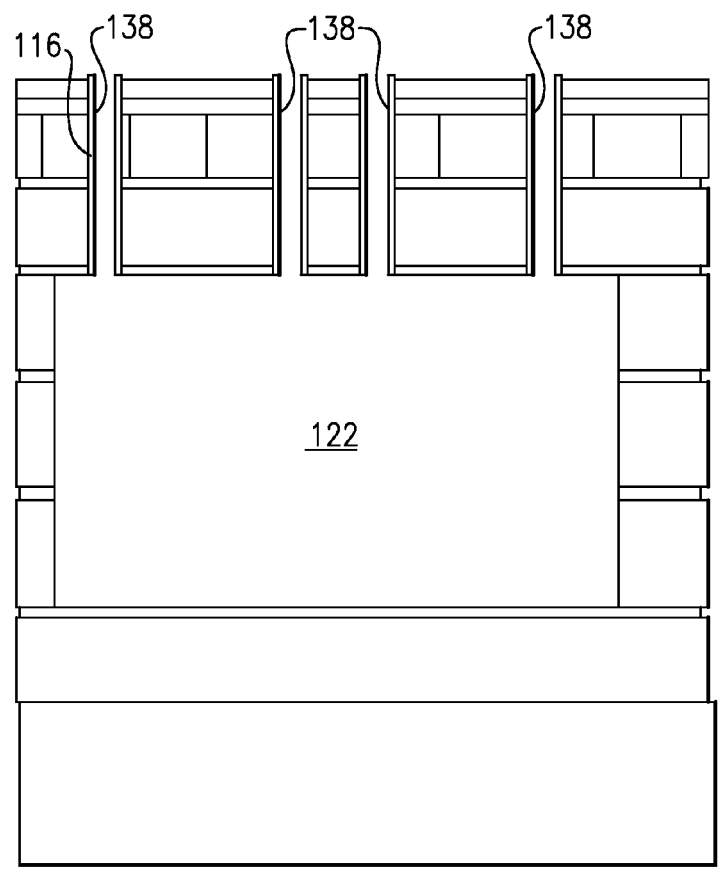

Next, as illustrated in FIG. 8, an etchant is introduced through the lined openings. The etchant isotropically etches the low-K ILD layers 124a, 124b and 124c and the dielectric cap layers 126b and 126c disposed between them. Using the etchant, these layers are etched isotropically at a sufficient rate and time to form a hollowed out region 122 therein. During this etch process, the linings 138 along walls of the openings 116 protect the dielectric cap layers 126d and 126e from harm by the etchant and prevent the openings 116 from widening. A cleaning process is then applied to clear the hollowed out region 122 of material to form the air gap 122. A passivation layer 121 (FIG. 3B) including a dielectric material such as silicon dioxide or silicon nitride, preferably then is deposited into the openings 116 to form plugs 130 which pinch off the openings to prevent fluids (moisture, gases, liquids, etc.) or other contaminants from entering the air gap 122. The material and the process by which it is deposited are selected such that the openings 116 become completely pinched off to seal the openings 116 without significantly shrinking the volume of the air gap 122.

As discussed above, in the embodiment illustrated in FIGS. 4A-4B, openings 136 and 146 in the ILD layers 114a and 114b are elongated in a direction of their length across the major surface of the passivation layer. Processing to form the structure illustrated therein is the same as that described with reference to FIGS. 5A through 8, with the following exception. The shape and dimensions of the openings 136 and 146 in the dielectric layers are defined by openings in the photo-imageable masking layer 147 which have corresponding shape and dimensions.

Figure 9A:
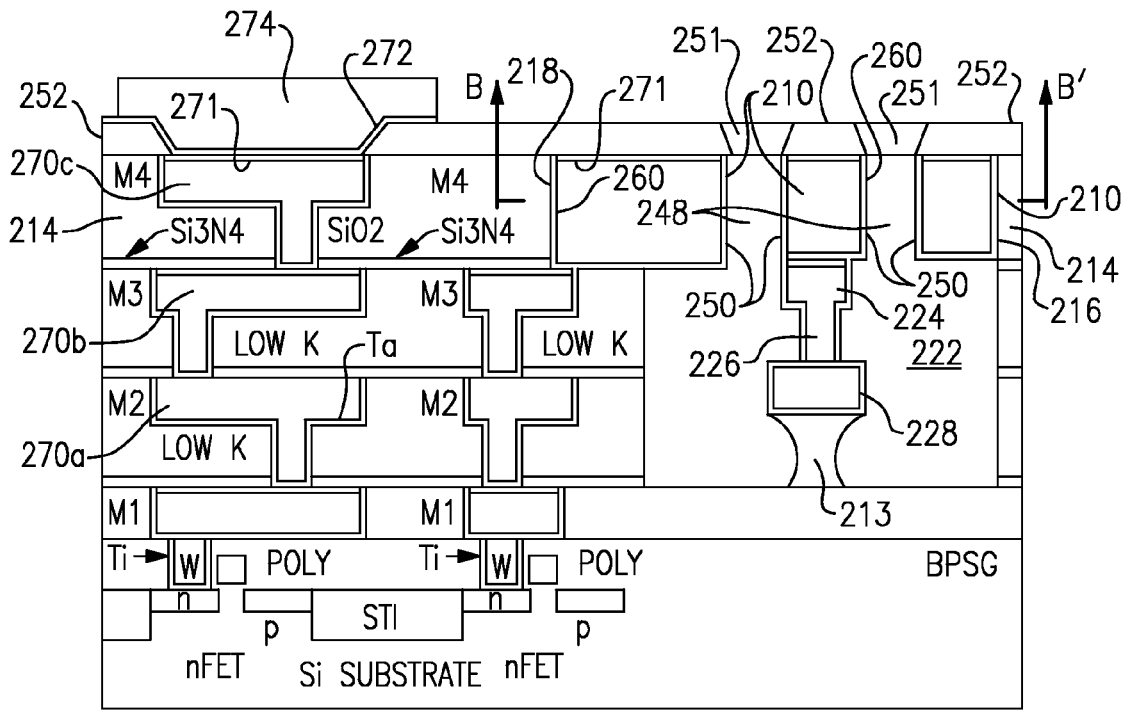
FIG. 9A is a sectional view illustrating an on-chip inductor structure in accordance with another embodiment of the invention.
Figure 9C:
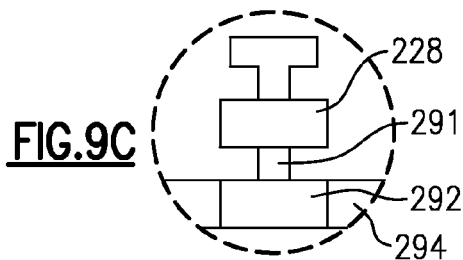
FIG. 9C is a corresponding fragmentary sectional view of the on-chip inductor structure illustrated in FIG. 9A.
Figure 9B:
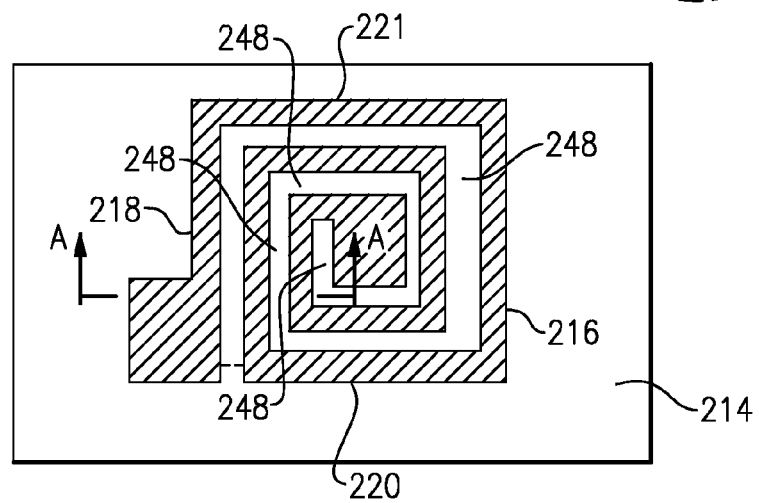
FIG. 9B is a corresponding plan view of the on-chip inductor structure illustrated in FIG. 9A.

FIGS. 9A-9B are a sectional view and corresponding top-down plan view of a microelectronic structure according to a variation of the embodiment of the invention described above. In this embodiment, the air gap 222 underlies metal patterns 210 of an inductor or other passive device in registration with the metal patterns. Prior to forming the air gap 222, the metal patterns 210 are provided in a dielectric layer 214 including an inorganic dielectric material, such dielectric layer 214 typically still supporting the metal patterns at peripheral edges, e.g., edges 216, 218 and at other peripheral edges 220 and 221 (FIG. 9B). As illustrated in FIG. 9A, each metal pattern 210 of the inductor preferably includes a conductive barrier layer 260 which lines a trench or slot within the dielectric layer 214, and a thicker conductor material which fills the trench or slot. Without intending to limit the choice of materials therefor, the conductive barrier layer illustratively includes a layer of metal such as tantalum, titanium, tungsten, or conductive nitride thereof, and the thicker conductor material consists essentially of copper.

Portions 248 of the air gap extend to lateral edges 250 of the conductor metal patterns 210, i.e., at least to edges of the conductive barrier layers 260. In addition, conductors from other conductive wiring levels of the chip connect to the metal pattern 210, for example, the M3 level conductor 224, via 226 and M2 conductor 228, and are exposed within the air gap 222, as shown in FIG. 9A. A pedestal 215 of dielectric material remains underlying M2 conductor 228 for supporting these conductors 228, 224, 210. Alternatively, the M2 conductor 228 can be supported by additional conductors including via 291 and M1 conductor 292 in an M1 dielectric layer 294, as illustrated in the fragmentary view of FIG. 9C.

As particularly illustrated in FIG. 9A, openings 248 between each conductor metal pattern 210 underlie openings 251 in a dielectric passivation layer 252 of the chip. These openings 251 preferably are sealed with a dielectric material different form the material of the passivation layer 252. In a preferred embodiment, the passivation layer 252 consists essentially of silicon nitride and the openings 251 therein are sealed with silicon dioxide. Preferably, the silicon dioxide material is deposited into openings 251 by a process which causes the openings to pinch off and become sealed before much silicon dioxide material enters the air gap 222 below the openings. Although FIG. 9a shows a single damascene process used for the last Cu wire level, dual or triple damascene could also be employed.

As further shown in FIG. 9A, an additional conductive layer 271 is aligned to each embedded copper conductor pattern 210 included in the inductor, as well as the conductor patterns 270a, 270b and 270c used as metal interconnects in metal levels M1, M2 and M3. Preferably, this conductive layer 271 includes CoWP (cobalt tungsten phosphorus), although other conductive materials are suitable for this purpose. The conductive layer 271 is used to improve adhesion between the copper conductor pattern 270c and a conductive layer 272 which includes tantalum nitride (TaN), for example. In turn, conductive layer 272, which overlies the passivation layer 252, provides adhesion to an overlying bond pad 274, and/or as a diffusion barrier between conductive layer 271 and 274.

Figure 10:
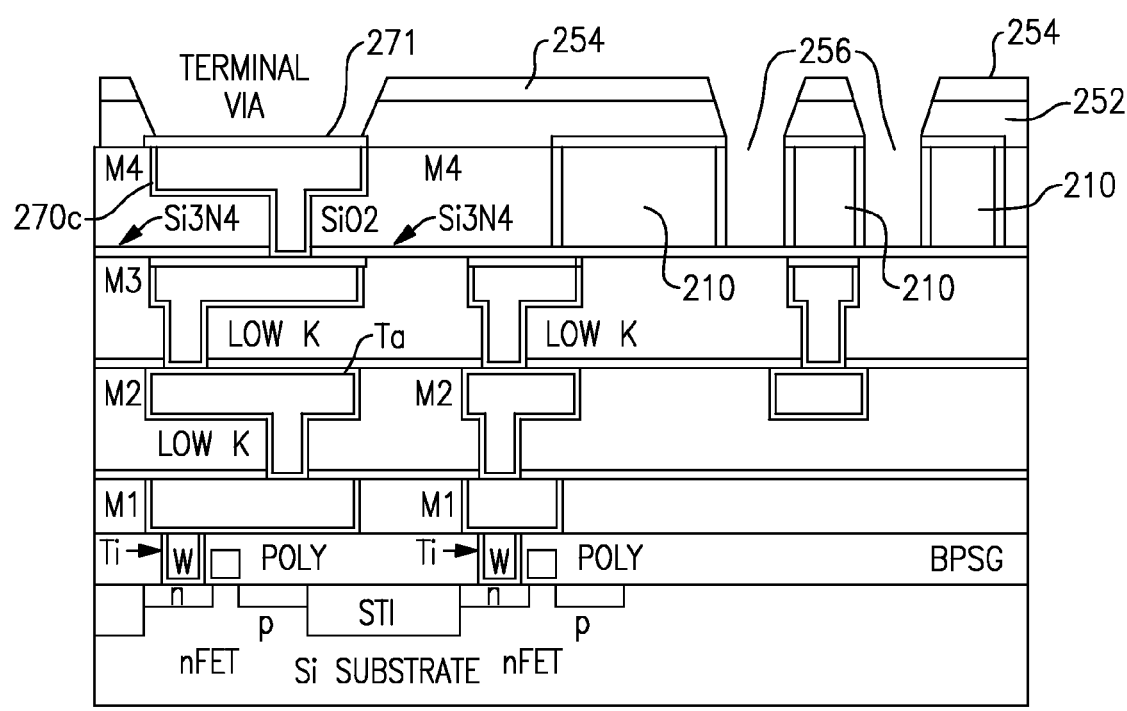
FIGS. 10-12 are sectional views illustrating stages in fabrication of the inductor structure illustrated in FIGS. 9A-9B.

FIG. 10 illustrates a stage of fabrication after an uppermost metal interconnect layer 270c (M4 layer) of the chip has been fully formed, as well as the copper conductor patterns 210 of an inductor. The conductive adhesion/barrier layer 271 overlies the interconnect layer 270c and each of the conductor patterns 210. Then, the passivation layer 252 is formed. Thereafter, in processing known as a "terminal via patterning," a photo-imageable layer 254 is deposited and then patterned via photolithography. Thereafter, the passivation layer is etched to expose the conductive layer 271 of the metal interconnect layer 270c. Simultaneously with the terminal via patterning, openings are made in the photo-imageable layer 254 overlying dielectric-filled spaces between the conductor patterns 210, and such that when the passivation layer is etched to expose the metal interconnect 270c, a major surface 256 of the ILD layer 214 is exposed between conductor patterns 210.

Figure 11:
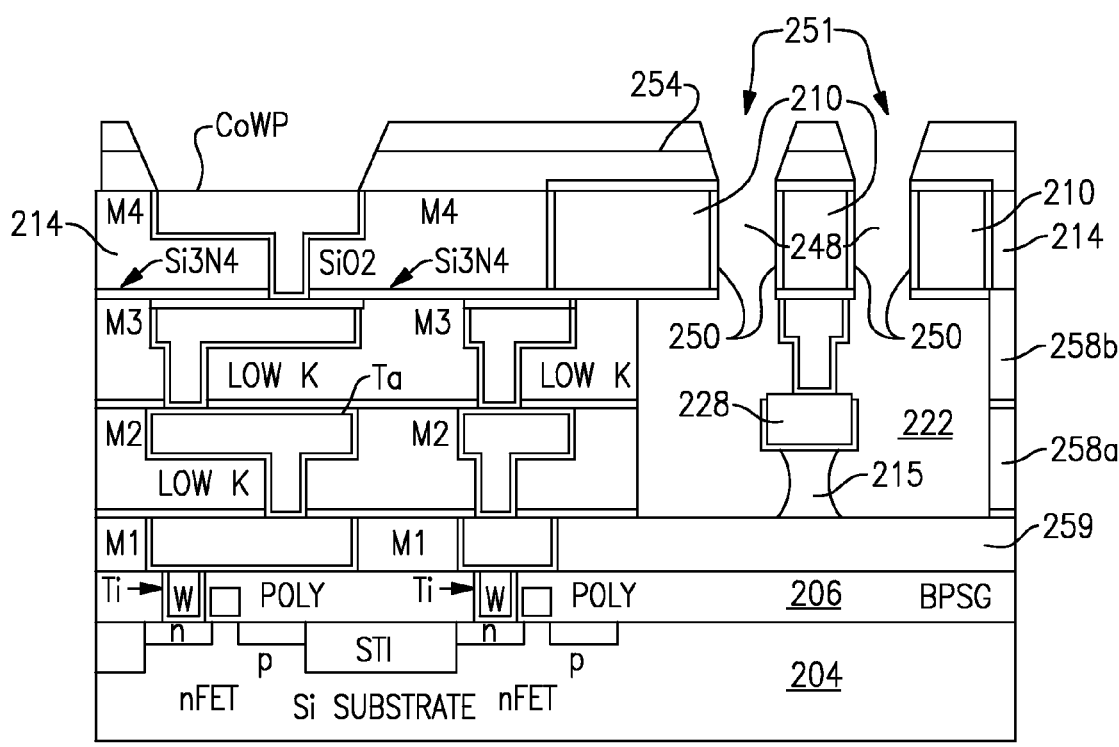

Thereafter, in the stage of processing illustrated in FIG. 11, material of the ILD layers underlying and between the conductor patterns 210 is removed. The dielectric material is removed in two stages. First, an etchant which attacks the inorganic dielectric layer 214 is introduced through the openings 251 in the passivation layer. Preferably, the inorganic dielectric layer 214 includes an oxide of silicon such as silicon dioxide and the etchant is selected appropriately therefor. This etch process removes material of the ILD layer 214 from between the lateral edges 250 of the conductor patterns 210 to form openings 248 in the ILD layer 214 which expose a major surface of an organic ILD layer 258b.

Thereafter a second etchant which attacks the organic ILD layer is introduced through openings 251 and openings 248. The organic ILD layer then is etched for a sufficient time and at a sufficient rate to open the air gap 222. In this step, an etchant is selected which selectively does not attack a dielectric layer 259 in which M1 metal patterns are provided, nor does it attack the dielectric layer 206 adjacent to the semiconductor region 204. For examples this "M1" dielectric layer 259 can include an inorganic material such as silicon dioxide, similar to dielectric layer 206 of borophosphosilicate ("BSPG") glass, which is not attacked by the etchant used to form the air gap in ILD layers 258a and 258b. At a conclusion of this etching process, owing to the area of the M2 conductor 228 and the thickness of the M2 layer underlying it, a pedestal of dielectric material 215 remains for supporting the overlying conductor structure including conductor 228.

Figure 12:
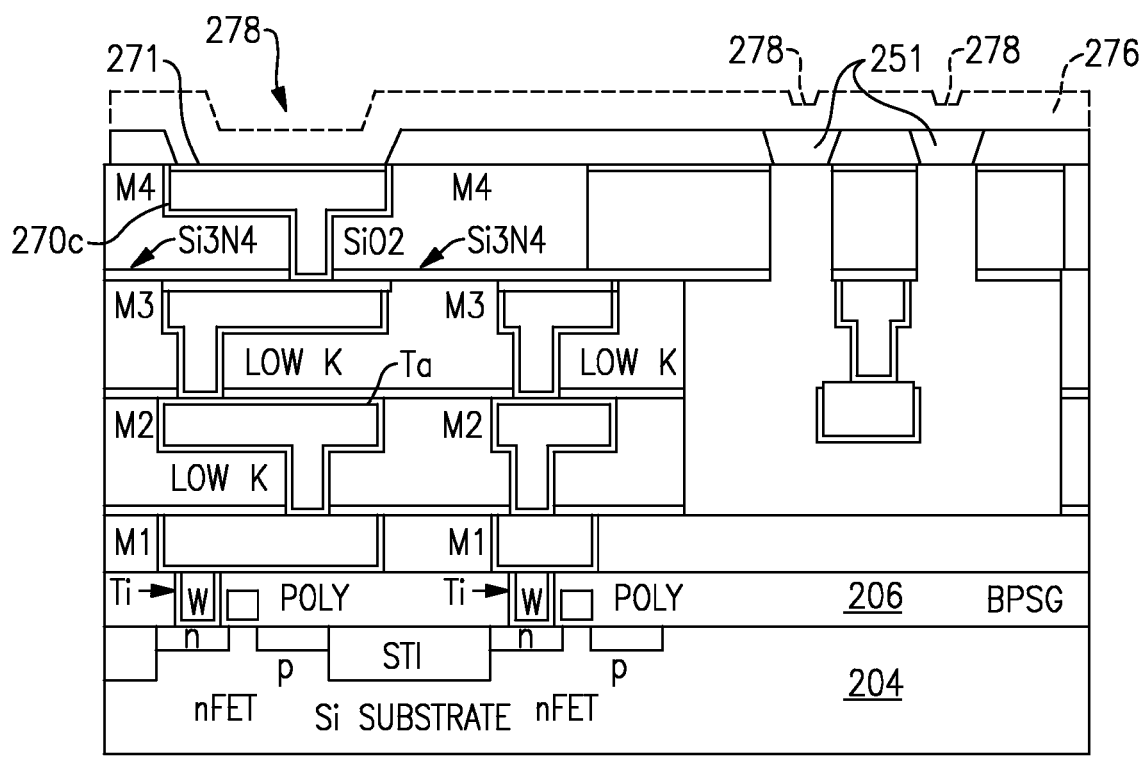

Thereafter, in the stage of processing illustrated in FIG. 12, a relatively thick layer 276 of silicon dioxide or other inorganic dielectric material is deposited to a sufficient thickness to fill openings 251 and pinch off quickly. As illustrated therein, the resulting layer 276 has, at most, small divots overlying the openings 251. At the same time, the layer 276 forms a large trough 278 overlying the conductive layer 271 of metal interconnect layer 270c. An oxide deposition process having a poor conformality, such as PECVD silicon dioxide deposited from a TEOS or SiH4 precursor can be used to pinch off openings 251. After depositing the oxide, a lithographically patterned etch process is used to etch the exposed dielectric layer 276 and uncover conductive layer 271 of the interconnect metal 270c. Alternatively, a blanket etchback could be employed which does not remove the oxide material which seals the openings because the divots 278 are relatively shallow over the openings 251. Thereafter, adhesion/barrier layer 272 and bond pad 274 are formed by subsequent depositions to complete the structure illustrated in FIGS. 9A and 9B.

A microelectronic structure in accordance with a variation of the embodiments described above is illustrated in FIGS. 13A and 13B. This structure 300 appears similar in plan view (FIG. 13A) to that of the structure illustrated in FIG. 3A. However, in this structure, a void 322, being an air gap or evacuated or gas-filled void is provided as a hollowed out portion of a semiconductor region 328, the void 322 underlying and being in registration with the conductor patterns 310 of an inductor. Openings 348 in ILD layer 314 in which the conductor patterns are provided preferably are sealed with a sealing medium which can include an inorganic or organic dielectric material. As in the embodiment described above with reference to FIGS. 3A, 3B a dielectric layer 325 and a stacked series of ILD layers 324a, 324b, 324c and 324d are provided between the void 322 and the conductor patterns 310. The ILD layers can be inorganic or organic in composition, or some can be organic in composition while others are inorganic in composition. In addition, dielectric cap layers 326a, 326b, 326c, 326d, and 326e are disposed between successive pairs of ILD layers. Openings 348 in these dielectric layers extend from the void 322 to a major surface of a dielectric layer 314 in which the conductor patterns 310 are provided.

Figure 13B:
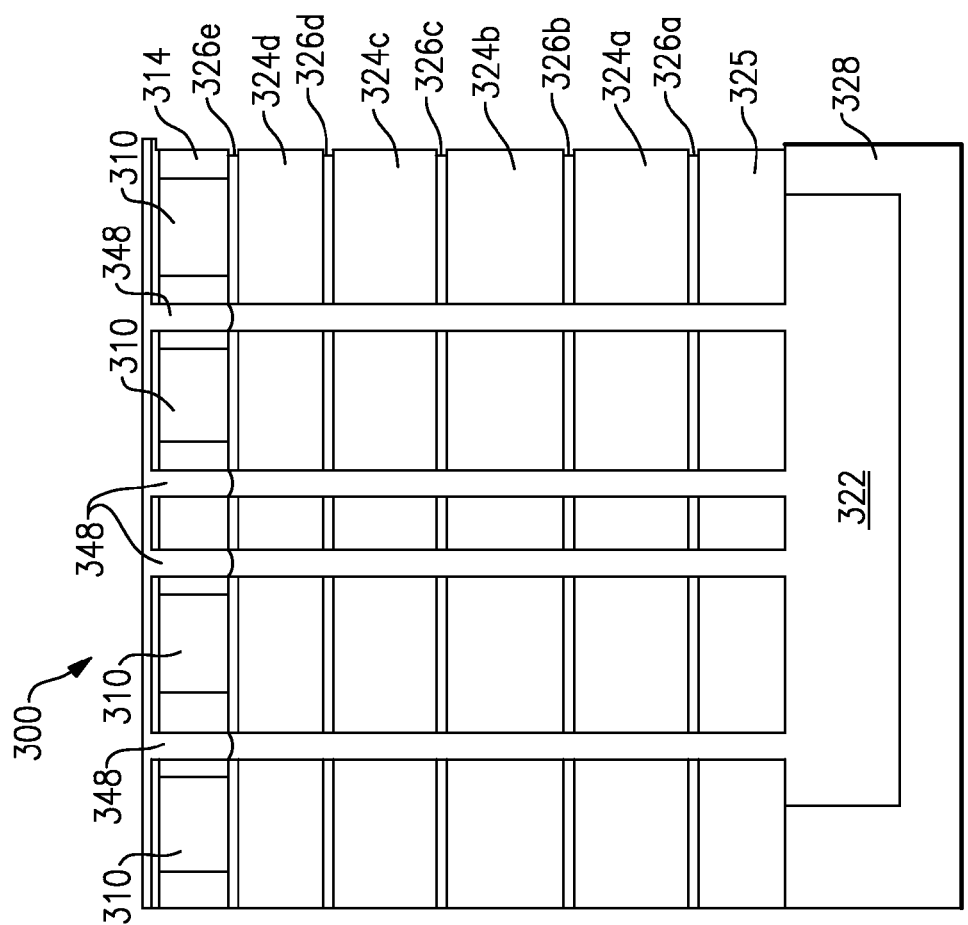
FIG. 13B is a corresponding sectional view further illustrating the on-chip inductor structure shown in FIG. 13A.
Figure 13A:
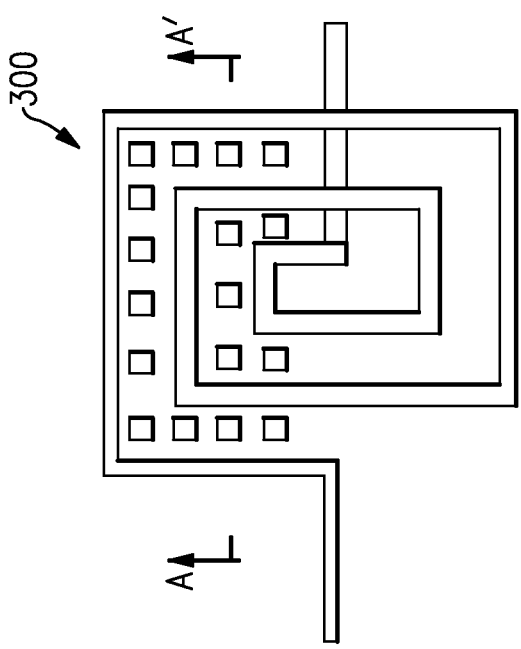
FIG. 13A is a top plan view illustrating an on-chip inductor structure in accordance with another embodiment of the invention.
Figure 14:
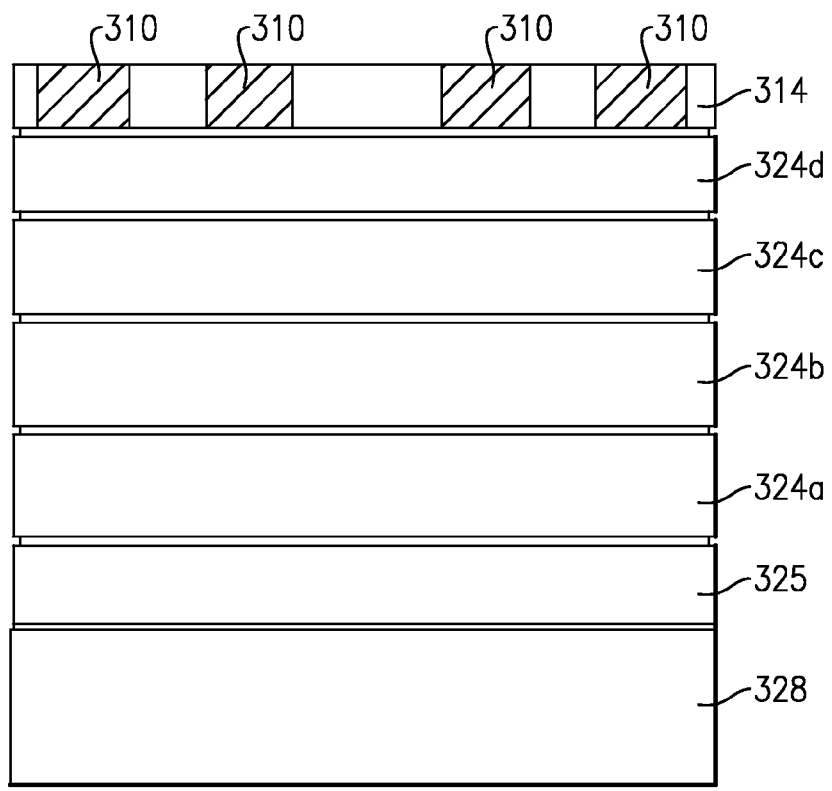
FIGS. 14-17 are sectional views illustrating stages in the fabrication of the on-chip inductor structure illustrated in FIGS. 13A-13B.

Referring to FIGS. 14-17, a method of fabricating the microelectronic structure shown in FIGS. 13A-13B will now be described. As illustrated in FIG. 14, processing to form the air gap begins after conductor patterns 310 of the inductor have already been defined within dielectric layer 314 above the series of stacked dielectric layers 324a, 324b, 324c, 324c and 325 overlying a semiconductor region 328 of the microelectronic substrate.

Figure 15:
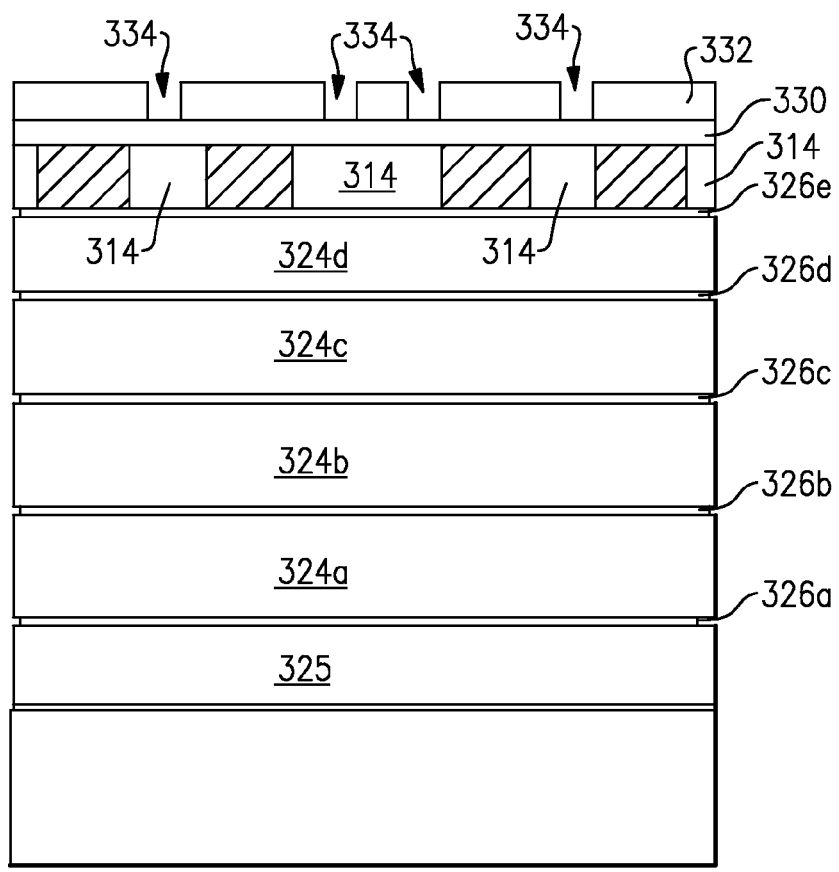
Figure 16:
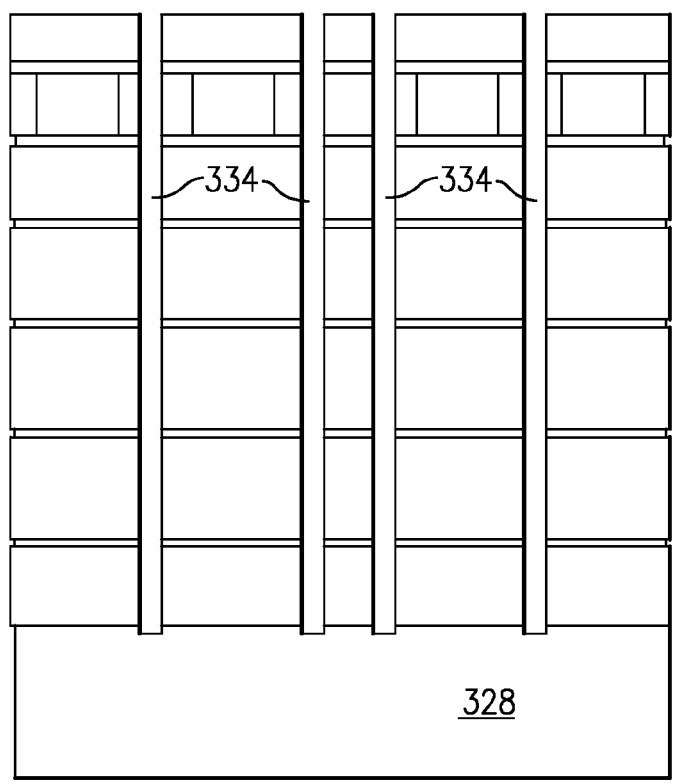
Figure 17:
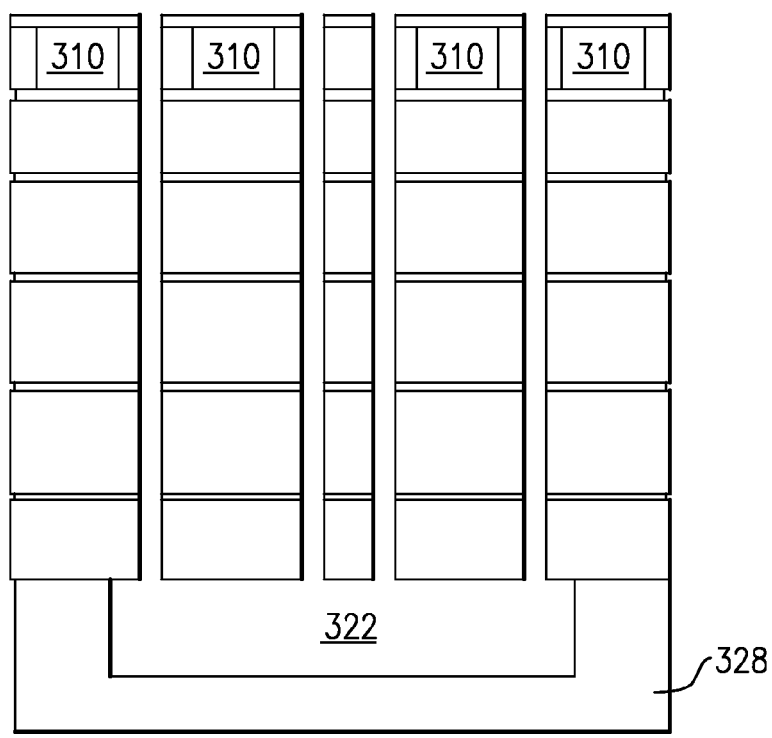

Thereafter, as illustrated in FIG. 15, a hard mask layer, preferably which includes silicon nitride, is deposited. Thereafter, a photo-imageable layer 332 is deposited and then patterned to form openings 334 in registration with portions of the dielectric layer 314. Then, an anisotropic vertical etch process is used to extend the openings in the photo-imageable layer downward through the series of inorganic and/or organic dielectric layers 324a, 324b, 324c, 324d and dielectric cap layers 326a, 326b, 326c, 326d, resulting in the arrangement illustrated in FIG. 16 in which the openings expose the semiconductor region 328. Next, as illustrated in FIG. 17, an etchant is introduced through the openings 334, the etchant removing semiconductor material of the semiconductor region 328 to form the evacuated or gas-filled, e.g., air-filled void 322 in registration with the conductor patterns 310.

Figure 18A:
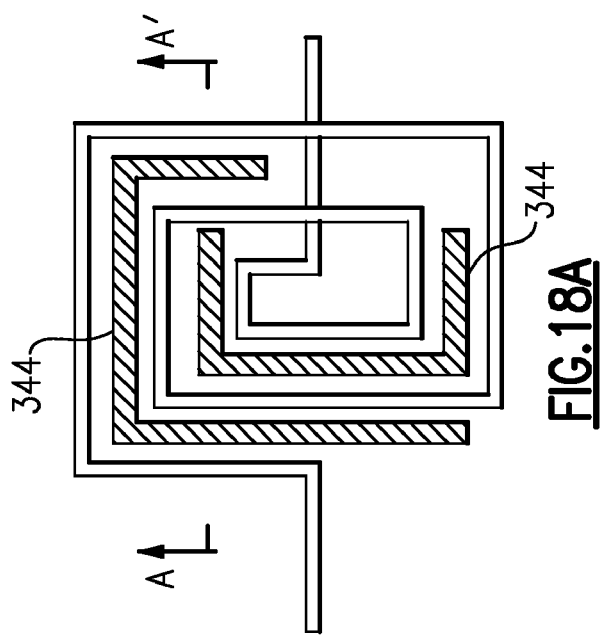
FIG. 18A is a plan view illustrating an on-chip inductor structure in accordance with a variation of the embodiment illustrated in FIGS. 13A-13B.
Figure 18B:
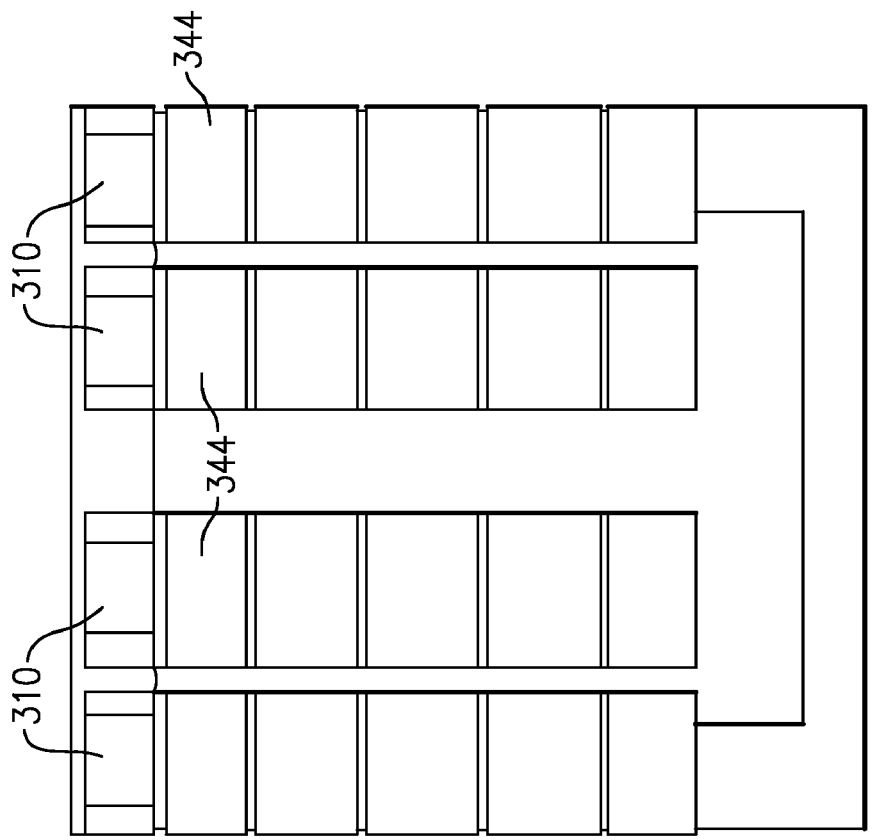
FIG. 18B is a corresponding sectional view of the on-chip inductor structure illustrated in FIG. 18A.

Referring now to FIGS. 18A and 18B, in a variation of the above-described embodiment, the openings 344 in the dielectric region 314 are elongated in a manner similar to that described above with reference to FIGS. 4A-4B.

Figure 19:
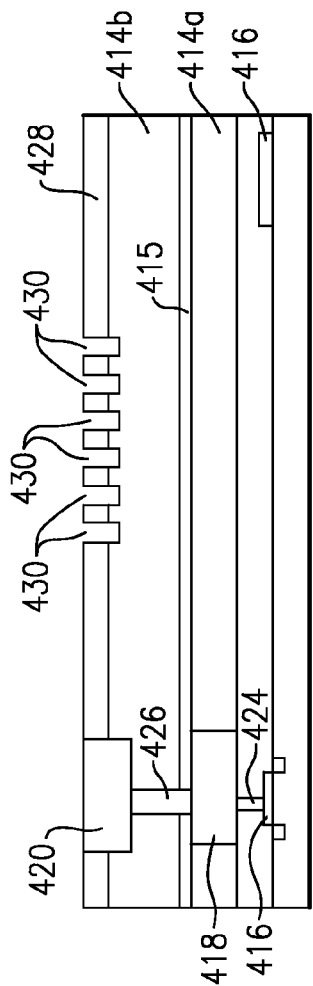
FIGS. 19 through 22 are sectional views illustrating the fabrication of an on-chip inductor structure in accordance with another embodiment of the invention.

Referring now to FIGS. 19-22, in a microelectronic structure according to another embodiment of the invention, a void 422 (FIG. 22) is formed prior to processing steps taken to fabricate a passive device 450 overlying the void. FIG. 19 illustrates a preliminary stage of fabrication after semiconductor devices 416 and first and second ILD layers 414a and 414b have been formed, in addition to an M1 wiring pattern 418, an M2 wiring pattern 420, and vertical conductive vias 424 and 426 which conductively connect the M1 and M2 wiring patterns together. A dielectric cap layer 415, preferably consisting essentially of silicon nitride, is disposed between the first and second ILD layers 414a and 414b. The first and second ILD layers 414a and 414b preferably have a low dielectric constant, which can be obtained by use of an inorganic dielectric material in these layers, such as SiCOH, p-SiCOH, FSG, silicon dioxide, p-silicon dioxide, and the like; as well as a variety of polymers.

After forming M2 metal pattern 420, the second dielectric layer is recessed, e.g., through use of a timed etch back process, and then a hard mask layer 428 is deposited to overlie the second ILD layer 414b and planarized to a top surface of the M2 metal pattern, e.g., via chemical mechanical polishing ("CMP"). The hard mask layer must be one which is not attacked by an etchant which attacks the dielectric layer immediately underlying it, nor the dielectric cap layer 415 which underlies the second ILD layer 414b. Accordingly, when the second dielectric layer 114b predominantly includes a composition such as SiOCH or p-SiCOOH a hard mask layer such as silicon dioxide is preferred. Alternatively, when the second ILD layer 114b predominantly includes a polymer, a hard mask layer including silicon nitride, silicon carbide or silicon carbonyl (SiCN) is preferred, A di-block copolymer masking layer is another composition suitable for use as a hard mask layer when the second ILD layer is an inorganic dielectric such as silicon dioxide and the like.

In the case of the inorganic hard mask compositions indicated above, a photo-imageable layer (not shown) is deposited and patterned by photolithography to form openings which expose a top surface of the hard mask layer 428. Thereafter, the hard mask is etched through the openings in the photo-imageable layer to form corresponding openings in the hard mask layer which extend at least to a surface of the second ILD layer 414b. This etching step can be performed via any suitable process. Preferably, the etch process is directional in nature, such as a vertical reactive ion etch process.

Figure 20:
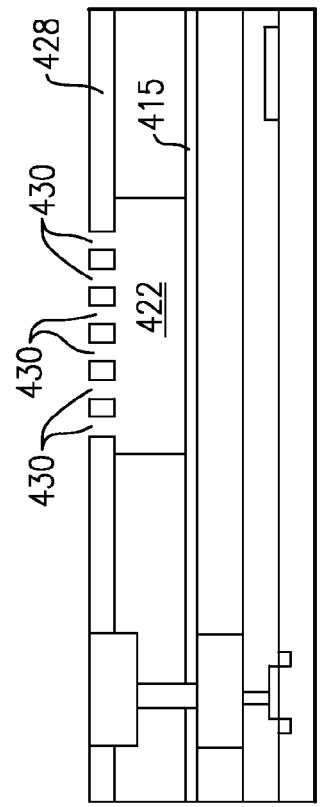
Figure 21:
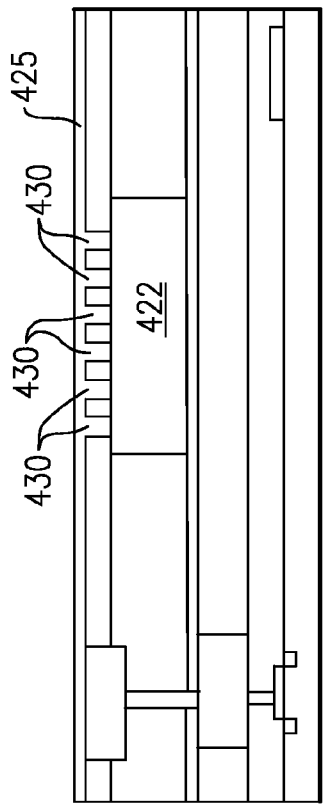

Thereafter, in a subsequent stage of fabrication shown in FIG. 20, a hollowed out region 422 is formed within the second ILD layer 414b. After subsequent processing steps, this hollowed out region will remain as the void 422, being an air-gap, other gas-filled or evacuated void in the completed microelectronic structure illustrated in FIG. 22. The hollowed out region is formed by supplying an etchant through the openings 430 in the hard mask layer to selectively remove a portion of the second ILD layer 414b in registration with the openings 430. This etch step is conducted using an etch process which proceeds isotropically and which does not attack the hard mask layer 428 or dielectric cap layer 415.

Preferably after an appropriate cleaning step and drying steps are performed, a further dielectric layer 425 is deposited to cover the remaining hard mask layer 428, in such manner as to fill the openings 430 in the hard mask layer. In one embodiment, layer 425 can be formed by depositing additional material which was used to deposit the hard mask layer. Alternatively, the dielectric layer 425 can be deposited to form a dielectric barrier layer using a material and a process similar to that used to form the dielectric cap layer 415. Preferably, this deposition step is performed such that the openings 430 become pinched off before much material is deposited into the void 422.

Figure 22:
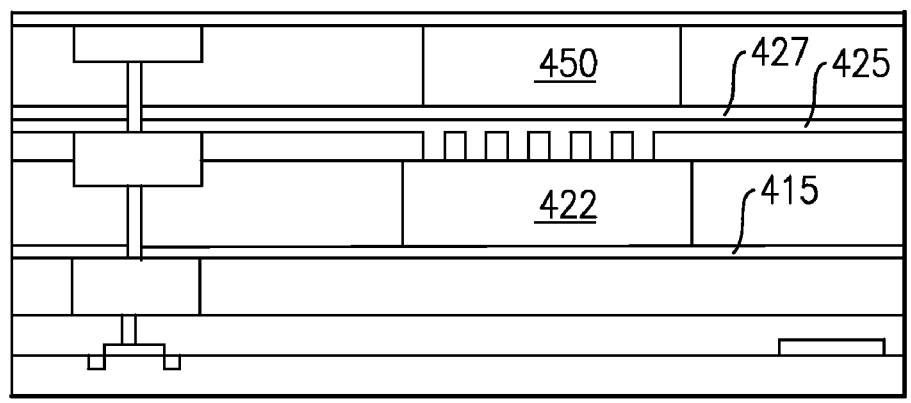

Thereafter, in the stage of fabrication illustrated in FIG. 22, a dielectric cap layer 427 is deposited to overlie dielectric layer 425, the dielectric cap layer 427 functioning as a barrier layer similar to that of dielectric layer 415. Optionally, this step can be avoided when the dielectric layer 425 already has the required characteristics for use as a barrier layer, as mentioned above.

Subsequently, a third ILD layer 414c and passive device 450 are formed. The passive device 450, being formed in registration with the void 422, can have improved performance. The passive device can include a capacitor or an inductor, among others. Using the fabrication techniques of this embodiment, a greater range of design flexibility of making passive devices can be achieved because there is no necessity for openings to extend through a dielectric layer after forming the passive device in the same dielectric layer. Note that the formation of the void 422 in the preferred embodiment within the second one of three ILD layers is not required. A greater number of ILD layers can be provided, and the void 422 can be formed within a higher or lower ILD layer than the second ILD layer.

Figure 23:
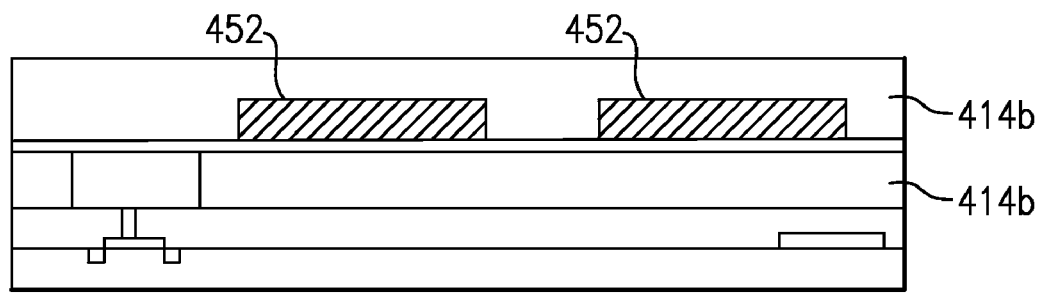
FIGS. 23 through 26 are sectional views illustrating the fabrication of an on-chip inductor structure in accordance with yet another embodiment of the invention.

FIGS. 23 through 26 illustrate a similar process of fabricating a microelectronic structure in which a passive device is formed after forming a void in an underlying ILD layer. In this embodiment, as illustrated in FIG. 23, a sacrificial layer is deposited and patterned to form mesas 452 overlying the dielectric cap layer 415. The ILD layer 414b then is deposited and planarized to form the structure shown in FIG. 23 the ILD layer 414b preferably including either an oxide or having a low-k dielectric composition such as SiCOH or PAE. The sacrificial layer 452 includes a material which can be removed by etching or cleaning in a process which does not harm the ILD layer 414b. A material such as PAE, polyimide, BCB (benzocyclobutane), an anti-reflective coating (ARC) material such as NFC, or a negative photoresist material, for example, is suitable for this purpose.

Figure 24:
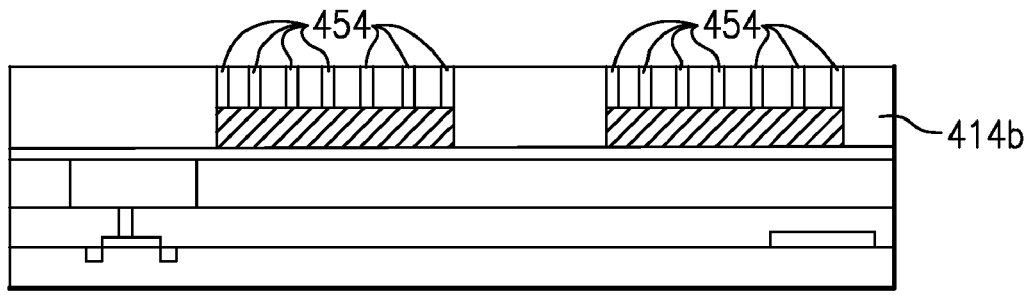

Thereafter, as illustrated in FIG. 24, the ILD layer 414b is patterned to form a series of openings, e.g., by depositing and patterning a photoresist material, and subsequently transferring the pattern therein to the ILD layer 414 using an etchant which attacks the ILD layer 414b. Preferably, a directional vertical etch process is used to avoid the openings from widening excessively. Then, by a process such as plasma oxygen ashing process, the sacrificial material 452 is attacked, removing it from its place in the ILD layer 414b.

Figure 25:
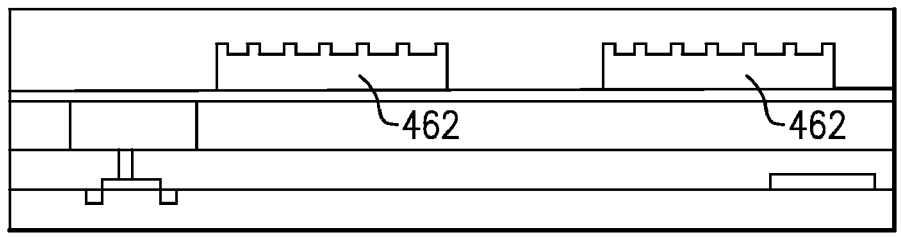

Next, as illustrated in FIG. 25, additional dielectric material is deposited to fill the openings in the ILD layer 414b, which typically also increases the thickness of the ILD layer 414b. This deposition step is performed to pinch off the openings, to seal the voids 462. Preferably, little dielectric material is deposited within the voids in this step. Preferably, the additional material includes an oxide of silicon, and the thickened ILD layer 414b is then planarized using a process such as CMP.

Figure 26:
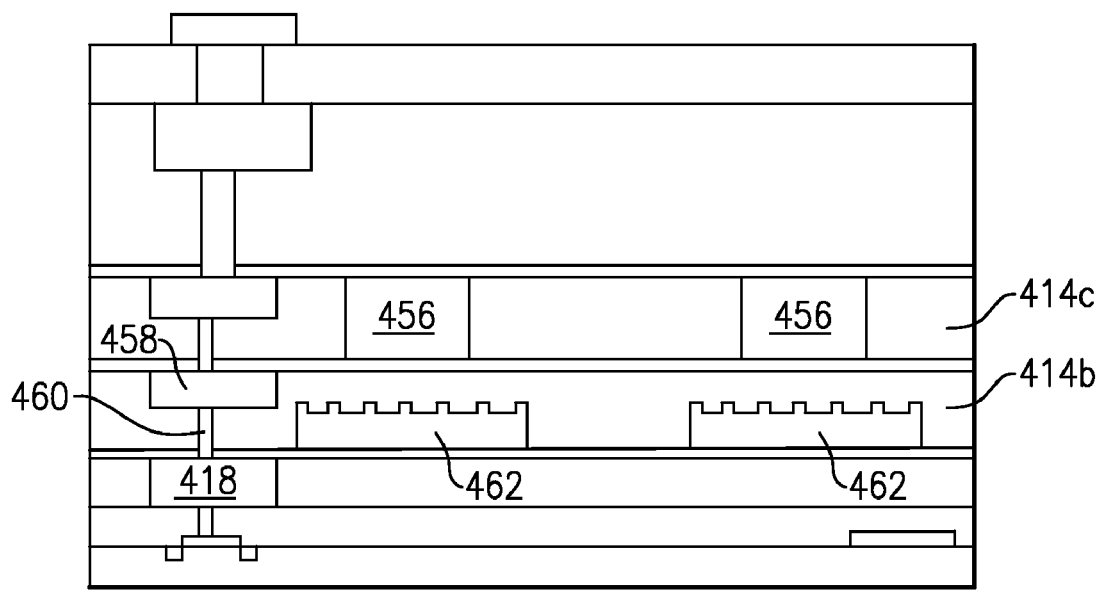

After forming the thickened ILD layer 414b, an M2 metal wiring pattern 458 is formed therein, as well as a conductive via 460 connecting the metal wiring pattern 458 to a lower (M1) metal pattern, as illustrated in FIG. 26. The completed microelectronic structure is illustrated in FIG. 26, in which passive devices are formed in a third ILD layer 414c in registration with the voids 462. As further shown in FIG. 26, optionally an additional ILD layer 414d or several such ILD layers can be formed in succession to overlie the passive devices 456.

While the invention has been described in accordance with certain preferred embodiments thereof, many modifications and enhancements can be made thereto without departing from the true scope and spirit of the invention, which is provided in the claims appended below,

What is claimed is:

1. A method of fabricating a microelectronic chip, comprising:
    forming a plurality of front-end-of-line ("FEOL") devices in a semiconductor region of the microelectronic chip;
    forming a plurality of stacked interlevel dielectric ("ILD") layers overlying the plurality of FEOL devices, the plurality of stacked ILD layers including a first ILD layer and a second ILD layer overlying the first ILD layer, the second ILD layer being resistant to attack by a first etchant which attacks the first ILD layer;
    forming a passive device overlying at least the first ILD layer; and
    using the first etchant, removing a portion of the first ILD layer in registration with the passive device to form an air gap underlying and in registration with the passive device by a process including exposing a surface of the first ILD layer by etching openings in the second ILD layer and applying the first etchant to the first ILD layer through the openings.

2. The method as claimed in claim 1, wherein the second ILD layer underlies the passive device and at least a portion of the second ILD layer remains after removing the portion of the first ILD layer, the remaining portion of the second ILD layer supporting the passive device.

3. The method as claimed in claim 1, wherein the first ILD layer consists essentially of an organic dielectric material and the second ILD layer consists essentially of an inorganic dielectric material which is resistant to attack by the first etchant.

4. The method as claimed in claim 1, wherein the second ILD layer has a major surface, each of the openings in the second ILD layer has a width in a direction aligned with a plane defined by the major surface and a length in another direction aligned with the plane, wherein neither one of the width nor the length is greater than about twice the other one of the width and the length.

5. The method as claimed in claim 1, wherein the second ILD layer has a major surface, each of the openings in the second ILD layer is elongated, each opening having a length in a direction of extension aligned with a plane defined by the major surface and a width in a direction across the opening.

6. The method as claimed in claim 1, wherein the passive device includes at least one of an inductor or a capacitor, wherein the step of forming the passive device includes forming a metal pattern included in the passive device while simultaneously forming a metal interconnect wiring pattern for interconnection with at least one of the plurality of FEOL devices.

7. The method as claimed in claim 1, further comprising sealing the openings in the second ILD layer after removing the portion of the first ILD layer.

8. The method as claimed in claim 1, further comprising depositing a material resistant to attack by the first etchant onto walls of the openings prior to the step of using the first etchant to remove the portion of the first ILD layer, the material protecting the walls during the removal of the portion.

9. The method as claimed in claim 1, wherein each of the plurality of conductors includes lateral edges, and the lateral edges of adjacent ones of the plurality of conductors are exposed within the openings.

10. A method of fabricating a microelectronic chip, comprising:
    forming a plurality of front-end-of-line ("FEOL") devices in a semiconductor region of the microelectronic chip;
    forming an interlevel dielectric region ("ILD") overlying the plurality of FEOL devices, the ILD being resistant to attack by a first etchant which attacks the semiconductor region;
    forming a passive device overlying the ILD region; and
    using the first etchant, removing a portion of the semiconductor region directly underlying the passive device to form an air gap underlying the passive device.

11. The method as claimed in claim 10, wherein the step of removing the portion of the semiconductor region includes exposing a surface of the semiconductor region by etching openings in the ILD region and supplying the first etchant through the etched openings to the exposed surface to remove the portion of the semiconductor region.

12. A method of fabricating a microelectronic chip, comprising:
    forming a plurality of front-end-of-line ("FEOL") devices in a semiconductor region of the microelectronic chip;
    forming a plurality of stacked interlevel dielectric regions ("ILDs") overlying the plurality of FEOL devices, the plurality of stacked ILDs including a first ILD layer and a second ILD layer, the second ILD layer being etch-resistant to a first etchant which attacks the first ILD layer;
    using the first etchant, removing a portion of the first ILD layer to provide an air gap underlying the second ILD layer; and
    then forming a passive device overlying the plurality of stacked ILDs, such that the air gap directly underlies the passive device.

13. The method as claimed in claim 12, further comprising forming a hard mask overlying the first ILD layer and forming openings in the hard mask prior to using the first etchant to remove the portion of the first ILD layer.

14. The method as claimed in claim 13, wherein the hard mask and the second ILD layer each includes an inorganic material and the first ILD layer includes a low dielectric constant organic dielectric material.

15. The method as claimed in claim 12, further comprising depositing a dielectric material to close the openings in the hard mask prior to forming the passive device.

16. The method as claimed in claim 12, wherein the first ILD layer includes an organic material, the second ILD layer includes an inorganic material which resists attack by a process which attacks the first ILD layer, and the second ILD layer overlies the first ILD layer.

17. The method as claimed in claim 16, further comprising exposing a surface of the first ILD layer by etching openings in the second ILD layer and the portion of the first ILD layer is removed by exposing the first ILD layer to something.

* * * * *